March 26, 1968 J. B. SETCHFIELD ET AL 3,375,145

METHOD OF MAKING SEMICONDUCTOR DEVICES

Filed Aug. 25, 1965 2 Sheets-Sheet 1

INVENTORS
JOHN B. SETCHFIELD
STANLEY G. ALLEN
BY Percy P. Lantzy
ATTORNEY

METHOD OF MAKING SEMICONDUCTOR DEVICES

Filed Aug. 25, 1965 2 Sheets-Sheet 2

INVENTORS
JOHN B. SETCHFIELD
STANLEY G ALLEN
BY Percy P. Lantzy
ATTORNEY

United States Patent Office 3,375,145

Patented Mar. 26, 1968

3,375,145
METHOD OF MAKING SEMICONDUCTOR DEVICES

John Bernard Setchfield and Stanley George Allen, London, England, assignors to International Standard Electric Corporation, New York, N.Y., a corporation of Delaware Filed Aug. 25, 1965, Ser. No. 482,423
11 Claims. (Cl. 148—177)

This invention realtes to semiconductor junction devices.

The utilisation at microwave frequencies of a conventional tunnel diode having a mesa construction in which the tunel junction is supported on an upstanding mesa or table requires the mesa neck to be of extremely small diameter, e.g. 0.0002 inch. In consequence of this, not only is the conventional structure very fragile, but the narrow unsupported neck requires a very flexible connection which adds appreciably to the parasitic inductance.

An object of the present invention is to obviate the frailty and to eliminate the extra parasitic inductance associated with the conventional structure.

According to the invention there is provided a method of manufacturing a semiconductor junction device which includes the steps of providing a layer of semiconductor material of one conductivity type on part of a face of an effectively insulating base, providing an electrically conducting layer on another part of said face spaced from said semiconductor layer, placing a pellet of impurity material of the opposite conductivity type in the space between said semiconductor layer and said conducting layer with the pellet in contact with each of said layers, and heating so as to alloy said impurity material with said semiconductor layer to form a junction therein and with said conducting layers to establish ohmic electrical connection between said opposite conductivity type material and said conducting layer.

The invention will be described with referense to the accompanying drawings, in which.

Figure 1:
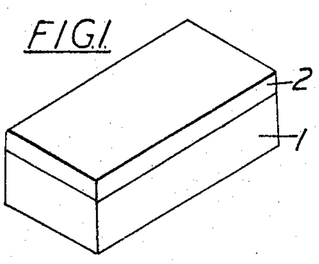
FIGS. 1 to 5 show successive stages in the manufacture of a tunnel diode, according to one embodiment of the invention.

Referring to FIG. 1, a base 1 of effectively insulating material e.g. with a resistivity of the order of $10^6$ ohm cm., with the correct structure for epitaxial deposition, for example semi-insulating gallium arsenide, has a layer 2 of p+ germanium epitaxially deposited on one face.

Figure 2:
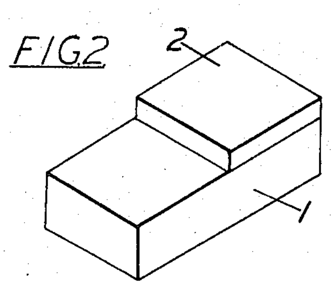

Part of the layer 2 is then removed (FIG. 2) over an area defined by masking and selective etching such as electrolytic etching.

Figure 3:
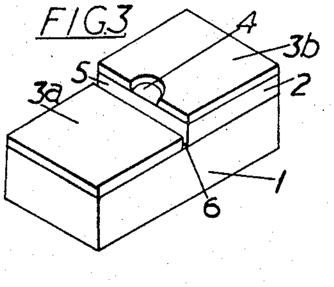

Metal layers *3a* and *3b* (FIG. 3), e.g. of gold, are then evaporated over the stepped surface except over areas 4, 5 and 6. Edge area 5 and the area 6 extending a short distance from the edge area left clear by shadowing by suitable positioning of the source in the evaporation process. Area 4 is left celar by suitable masking.

The metallised areas *3a* and *3b* are now alloyed in and built up by electroplating.

Figure 4:
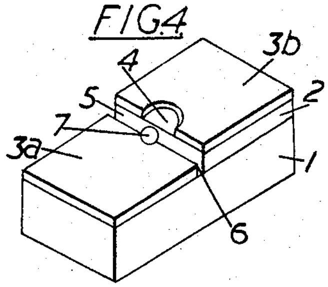

A tin-arsenic sphere 7 is then located as shown in FIG. 4 abutting the edge of the step to the layer 2 from the metal layer *3a* within the metal free area 4, and subjected to the usual alloying process in non-oxidising atmosphere.

Figure 5:
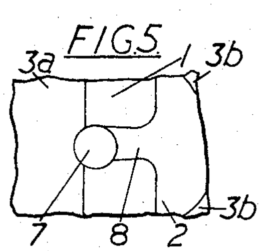

This results in the formation of the tunnel junction, and as a final step (FIG. 5), the step is etched back into the layer 2 by electrolytic etching to form a narrow neck 8 equivalent to the upstanding neck in a conventional structure. In the present configuration, the neck and the junction region are totally mechanically supported by the base 1.

The metal areas *3a* and 36 perform the functiont of ohmic contacts to the device, one to each side of the junction.

Figure 6:
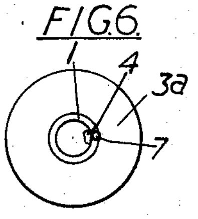
FIGS. 6 and 7 are plan and side views respectively of a tunnel diode suitable for mounting in a coaxial line.
Figure 7:
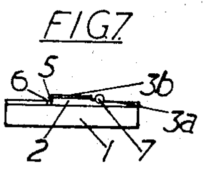

FIGS. 6 and 7 show a form of the device suitable for direct connection to a coaxial line. The diode is of circular plan configuration, manufactured as described above and having a structure referenced by the same numbers as those already used, namely an effectively insulating base 1, a central p+ germanium layer 2, metal ohmic contacts *3a* and *3b*, and an alloyed in sphere 7 adjacent to clear area 4 with the step edge areas 5 and 6 also clear of metal.

Figure 8:
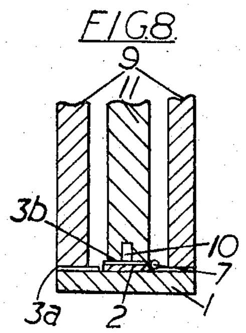
FIG. 8 shows the mounting of the tunnel diode of FIGS. 6 and 7 in a coaxial line.

As shown in FIG. 8 the outer conductor 9 of a coaxial line is terminated directly on the outer annular contact *3a* and a spigot 10 extends from the central metal layer *3b* into the inner conductor 11.

Figure 9:
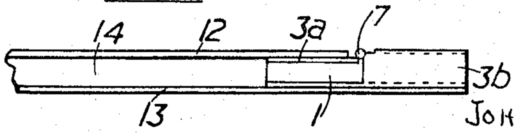
FIG. 9 shows a tunnel diode mounted in a strip line.

A diode of rectangular plan configuration is mounted in strip line as shown in FIG. 9. Strip conductor 12 and ground plane conductor 13 each extend beyond the dielectric 14, and the diode is inserted between the conductors 12 and 13 with the ohmic contact *3a* contacting the underside of the strip conductor 12.

The ohmic contact *3b* is extended from the surface of the diode carrying the tunnel junction by metallising along the rear sides and the bottom of the diode, and contacts the ground plane conductor 13 along the bottom of the diode.

Figure 10:
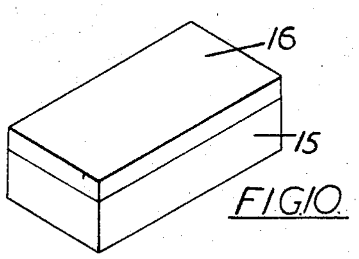
FIGS. 10 to 13 show successive stages in the manufacture of a tunnel diode according to another embodiment of the invention.

Referring now to FIG. 10, a base 15 of effectively insulating material, e.g. with a resistivity of the order of $10^6$ ohm cm., with the correct structure for epitaxial deposition, for example semi-insulating gallium arsenide, has a layer 16 of p+ germanium epitaxially deposited on one face.

Figure 11:
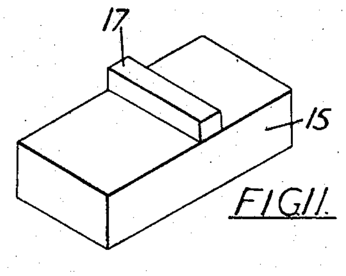

Parts of the layer 16 are then removed (FIG. 11) over areas defined by masking and selective etching such as electrolytic etching to leave a transverse ridge 17 of germanium.

Metal layers *18a* and *18b* (FIG. 12), e.g. of gold, are then evaporated over the stepped surface except over areas 19, 20 and 21. Edge area 20 and the area 21 extending a short distance from the edge are left clear by shadowing by suitable positioning of the source in the evaporation process. Area 19 is left clear by suitable masking.

The metallised areas *18a* and *18b* are now alloyed in and built up by electroplating.

Figure 12:
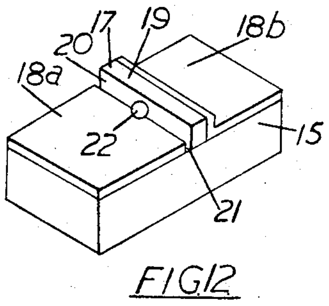

A tin-arsenic pellet 22 is then located as shown in FIG. 12 abutting the edge 20 of the step to the ridge 17 from the metal layer *18a* within the metal free area 20, and subjected to the usual alloying process in a non-oxidising atmosphere.

Figure 13:
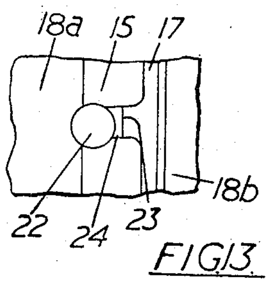

This results in the formation of a tunnel junction 23, FIG. 13 after which the step is etched back into the ridge 17 by electrolytic etching to form a narrow neck 24 equivalent to the upstanding neck in a conventional structure. The neck 24 and the junction 23 are totally mechanically supported by the base 15.

The metal areas *18a* and *18b* perform the function of ohmic contacts to the device, one to each side of the junction.

As an optional final step, the width of the ridge 17 may be reduced by removing the semiconductor material on each side of the junction region, together with the part of the metal layer 18*b* in contact therewith at the side of the ridge remote from the junction.

By extending one of the metal areas 18 around to the underside of the base 15, the device is suitable for mounting in strip line in similar manner to that described with reference to FIG. 9.

Devices constructed as described above result in rugged one-piece structures having no flexible contacts thereto, and permit lower parasitic inductance and capacitance and series resistance than with a conventional structure.

The germanium layer may be replaced by a layer of any other suitable semiconductor or semiconducting compound such as GaSb. The gallium arsenide insulating layer can be replaced by any other suitable insulator, such as single crystal sapphire or any other insulator on which an epitaxial semiconductor layer may be grown. Shaping of the ohmic contacts may be an advantage.

It is to be understood that the foregoing description of specific examples of this invention is made by way of example only and is not to be considered as a limitation on its scope.

What we claim is:

1. A method of manufacturing a semiconductor junction device which includes the steps of providing a layer of semiconductor material of one conductivity type on part of a face of an effectively insulating base, providing an electrically conducting layer on another part of said face spaced from said semiconductor layer, placing a pellet of impurity material of the opposite conductivity type in the space between said semiconductor layer and said conducting layer with the pellet in contact with each of said layers, and heating so as to alloy said impurity material with said semiconductor layer to form a junction therein and with said conducting layer to establish ohmic electrical connection between said opposite conductivity type material and said conducting layer.

2. A method as claimed in claim 1 in which the area of the junction is reduced after its formation by etching the semiconductor material.

3. A method as claimed in claim 2 in which the etching is performed electrolytically.

4. A method as claimed in claim 1 in which said layer of semiconductor material is provided by epitaxial deposition over the whole of said face followed by removal of the unrequired semiconductor material.

5. A method as claimed in claim 1 in which a further electrically conducting layer is provided on said semiconductor layer except in the region of the junction.

6. A method as claimed in claim 1 in which a further electrically conducting layer is provided on the face of said base and contacting the said semiconductor layer.

7. A method as claimed in claim 6 in which the two conducting layers are provided by evaporating metal on to the required areas, alloying in the evaporated metal, and building up by electroplating.

8. A method as claimed in claim 5 in which the two conducting layers are arranged side by side.

9. A method as claimed in claim 6 in which the two conducting layers are coaxial.

10. A method as claimed in claim 1 in which the semiconductor material is degeneratively doped on each side of the junction.

11. A method as claimed in claim 1 in which the base is of sapphire or gallium arsenide and the semiconductor material is germanium.

References Cited

UNITED STATES PATENTS

| | | | |
|---|---|---|---|
| 2,846,626 | 8/1958 | Nowak | 148—177 |
| 2,960,640 | 11/1960 | Emeis | 148—177 |
| 3,160,534 | 12/1964 | Oroshnik | 148—177 |
| 3,322,581 | 5/1967 | Hendrickson et al. | 148—175 |

HYLAND BIZOT, *Primary Examiner.*

RICHARD O. DEAN, *Examiner.*